US012680167B2

(12) United States Patent  
Masuda

(10) Patent No.: US 12,680,167 B2  
(45) Date of Patent: Jul. 14, 2026

(54) STAGE FOR HEATING AND COOLING OBJECT

(71) Applicant: ADVANTEC CO., LTD., Tokyo (JP)

(72) Inventor: Yuji Masuda, Tokyo (JP)

(73) Assignee: ADVANTEC CO., LTD., Tokyo (JP)

( * ) Notice: Subject to any disclaimer, the term of this patent is extended or adjusted under 35 U.S.C. 154(b) by 923 days.

(21) Appl. No.: 17/782,929

(22) PCT Filed: Oct. 23, 2020

(86) PCT No.: PCT/JP2020/039995  
§ 371 (c)(1),  
(2) Date: Jul. 14, 2022

(87) PCT Pub. No.: WO2021/111760  
PCT Pub. Date: Jun. 10, 2021

(65) Prior Publication Data  
US 2023/0002904 A1 Jan. 5, 2023

(30) Foreign Application Priority Data

Dec. 6, 2019 (JP) ................................. 2019-221514

(51) Int. Cl.  
C23C 16/46 (2006.01)  
C23C 16/458 (2006.01)  
H01L 21/687 (2006.01)  
H10P 72/76 (2026.01)

(52) U.S. Cl.  
CPC ........ *C23C 16/463* (2013.01); *C23C 16/4583* (2013.01); *H10P 72/7624* (2026.01)

(58) Field of Classification Search  
USPC ......................................................... 118/500  
See application file for complete search history.

(56) References Cited

U.S. PATENT DOCUMENTS

| | | | | |
|---|---|---|---|---|
| 4,091,355 A | * | 5/1978 | Beck | H05B 3/66 |
| | | | | 373/134 |
| 5,558,717 A | * | 9/1996 | Zhao | H01L 21/68742 |
| | | | | 118/728 |
| 5,810,933 A | * | 9/1998 | Mountsier | H01L 21/67109 |
| | | | | 118/728 |

(Continued)

FOREIGN PATENT DOCUMENTS

| | | |
|---|---|---|
| EP | 0899777 A2 | 3/1999 |
| JP | 1994-260430 A1 | 9/1994 |

(Continued)

OTHER PUBLICATIONS

European Extended Search Report and Opinion, Nov. 17, 2023, European Patent Office.

*Primary Examiner* — Jethro M. Pence  
(74) *Attorney, Agent, or Firm* — Liang Legal Group, PLLC

(57) ABSTRACT

A stage for heating and cooling an object installed in a chamber 1 includes : a stage body 5, 6 that has a mounting surface on which an object is mounted; a heating unit 7 for heating the mounting surface; and a cooling unit 8 for cooling the mounting surface. The stage body 5, 6 also has a first groove 10 into which the heating unit is inserted and a second groove 10 into which the cooling unit is inserted. The gap between the first groove and the heating unit and the gap between the second groove and the cooling unit have a heat-conductive medium.

5 Claims, 5 Drawing Sheets

(56) References Cited

U.S. PATENT DOCUMENTS

| | | | | |
|---|---|---|---|---|
| 5,846,375 A * | 12/1998 | Gilchrist | .......... | H01J 37/32724 |
| | | | | 118/724 |
| 6,043,468 A * | 3/2000 | Toya | ...................... | C30B 15/14 |
| | | | | 219/544 |
| 6,117,349 A * | 9/2000 | Huang | ............. | H01J 37/32431 |
| | | | | 438/729 |
| 6,391,112 B1 * | 5/2002 | Mahler | ............ | H01L 21/67109 |
| | | | | 269/21 |
| 6,949,722 B2 * | 9/2005 | Strang | ............. | H01L 21/67109 |
| | | | | 266/252 |
| 7,311,782 B2 * | 12/2007 | Strang | ............. | H01L 21/68757 |
| | | | | 118/724 |
| 9,438,140 B2 * | 9/2016 | Takasaki | ............. | H01L 21/6831 |
| 9,892,942 B2 * | 2/2018 | Nam | ................ | H01L 21/67115 |
| 10,825,662 B2 * | 11/2020 | Moriya | .................... | G01S 17/08 |
| 2007/0029740 A1 | 2/2007 | Natsuhara et al. | | |
| 2007/0090516 A1 | 4/2007 | White | | |
| 2008/0274297 A1 | 11/2008 | Furuta et al. | | |
| 2021/0020416 A1 * | 1/2021 | Moriya | ............ | H01L 21/67259 |
| 2022/0025516 A1 * | 1/2022 | Jin | ...................... | C23C 16/4408 |

FOREIGN PATENT DOCUMENTS

| | | |
|---|---|---|
| JP | H06-260430 | 9/1994 |
| JP | 1998-050811 A1 | 2/1998 |
| JP | 2000-021890 A1 | 1/2000 |
| JP | 2000021890 A | 1/2000 |
| JP | 2007-043042 A1 | 2/2007 |
| JP | 2007043042 A | 2/2007 |
| JP | 5427367 B | 12/2013 |
| KR | 10-2010-0137795 A | 12/2010 |
| KR | 20100137795 | 12/2010 |

* cited by examiner

STAGE FOR HEATING AND COOLING OBJECT

BACKGROUND

Technical Field

This invention relates to a stage for heating and cooling an object.

Background Art

Japanese Patent No. 5427367 discloses a rectangular susceptor. The susceptor is used as a stage when, for example, semiconductor integrated circuits, flat display panels, and solar photovoltaic power generation panels are manufactured. The susceptor heats, for example, a substrate in a manufacturing process. Then, quickly and uniformly heating the substrate is required. Additionally, preferably, the substrate can be cooled.

Patent Document 1: Japanese Patent No. 5427367

SUMMARY OF THE INVENTION

Problems to be Solved by the Invention

An object of this invention is to provide a stage configured to heat and cool a substrate. Further, an object of this invention is to provide a stage capable of uniformly heating (or cooling) a substrate.

Solutions to the Problems

The problem described above can be solved by a stage including not only a heating unit that heats a mounting surface of the stage but also a cooling unit. Additionally, the problem described above can be solved by filling a gap of a groove that houses the heating unit or the cooling unit with a heat-conductive medium.

A first aspect of the present invention relates to a stage installed inside a chamber for heating and cooling an object.

An example of the chamber includes a vacuum chamber. Examples of the object include a semiconductor integrated circuit, a flat display panel, and a solar photovoltaic power generation panel or substrates in the middle of manufacturing them. A stage 1 includes a stage body 5, 6, a heating unit 7, and a cooling unit 8. The stage body 5, 6 has a mounting surface on which an object is mounted. The heating unit 7 is for heating the mounting surface. The cooling unit 8 is for cooling the mounting surface. The cooling unit 8 may cool the object mounted on the mounting surface and may be used to heat the object at a temperature lower than the heating unit 7. The heating unit 7 and the cooling unit 8, for example, may be installed so as to swirl such that the stage can be uniformly heated or cooled. For example, to circulate a fluid from the lower side at the center of the stage to the inside of the heating unit 7 and the cooling unit 8, the heating unit 7 and the cooling unit 8 are preferably designed so as to move around the stage.

In a preferred aspect of this stage, the stage body 5, 6 further includes a first groove 10 and a second groove 10. Into the first groove 10, the heating unit 7 is inserted. Into the second groove 10, the cooling unit 8 is inserted. The first groove 10 and the second groove 10 are preferably disposed inside the stage bodies 5, 6. In this case, the first groove 10 and the second groove 10 may have a tunnel (hole) shape housing the heating unit 7 and the cooling unit 8. The first groove 10 and the second groove 10 only need to have a size of ensuring housing certain parts of the heating unit 7 and the cooling unit 8. The preferred stage 1 includes a heat-conductive medium 13 in a gap between the first groove and the heating unit and a gap between the second groove and the cooling unit. The heat-conductive medium 13 is preferably filled in the gaps described above.

In a preferred aspect of this stage, the heat-conductive medium 13 is a silver, a grease, a metallic fiber, or a gas. The heat-conductive medium 13 may be a noble gas. The noble gas may be a helium gas having a pressure of 0.1 atmospheres or more to 100 atmospheres or less (1 atmosphere or more to 100 atmospheres or less, 0.1 atmospheres or more to 10 atmospheres or less, or 2 atmospheres or more to 10 atmospheres or less). The silver is preferably a silver paste. An example of the grease includes a silicon grease. When the stage is used for heating, especially a process of CVD and Etch, a corrosive gas is used. Accordingly, as a material of the stage, an aluminum having high resistance against the corrosive gas is often used. However, since the aluminum decreases in strength at high temperature, increasing the pressure of the noble gas bulges the stage like a balloon microscopically, increases a distance between the end part and the substrate, and causes a problem in temperature uniformity of the substrate. Therefore, a heating process of CVD or Etch generates a region that ensures meeting both of heat performance and temperature uniformity by controlling the pressure of the noble gas to 0.1 atmospheres to 0.5 atmospheres, which is close to vacuum.

A second aspect of the present invention relates to a vacuum device that includes any of the stages described above as a susceptor. The vacuum device is used to manufacture, for example, a semiconductor integrated circuit, a flat display panel, or a solar cell panel. The vacuum device usually includes a chamber and a vacuum pump to evacuate the chamber. The vacuum device may include an introduction portion to introduce various samples into the chamber. The vacuum device may include a sensor and a measurement device for various measurements as necessary. An example of the chamber includes a process chamber to manufacture an object. Examples of the flat display panel include an organic EL display, a plasma display, and a liquid crystal display.

A third aspect of the present invention relates to a method for manufacturing a semiconductor integrated circuit, a flat display panel, or a solar cell panel using the vacuum device described above. The method for manufacturing semiconductor integrated circuit is publicly known as disclosed in, for example, Japanese Patent No. 3956697, Japanese Patent No. 3519589, and Japanese Patent No. 3064993. The method for manufacturing flat display panel is publicly known as disclosed in, for example, Japanese 4604752. The method for manufacturing solar cell panel is publicly known as disclosed in, for example, Japanese Patent No. 6555964, Japanese Patent No. 6498053, and Japanese Patent No. 5386044.

Advantageous Effects of the Invention

With this invention, not only the heating unit that heats the mounting surface of the stage but also the cooling unit is provided, and therefore the mounting surface of the stage can be heated and cooled. Additionally, with a preferred example of this invention, the heat-conductive medium is provided in the gap of the groove housing the heating unit or the cooling unit, and therefore the mounting surface can be uniformly heated (and cooled).

DETAILED DESCRIPTION OF THE INVENTION

The following describes configurations to embody the present invention using the drawings. The present invention is not limited to the configurations described below, but includes those appropriately modified from the configurations below by a person skilled in the art within an obvious range.

Figure 1A:
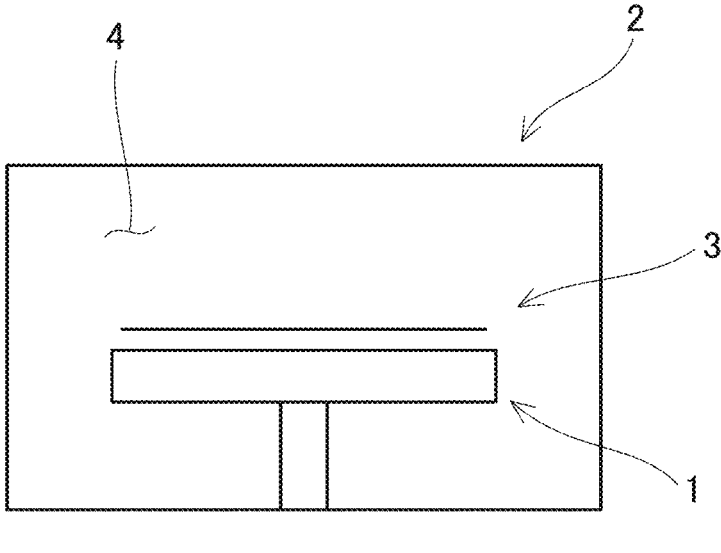
FIG. 1(A) is a conceptual diagram illustrating a situation of installation of a stage.
Figure 1B:
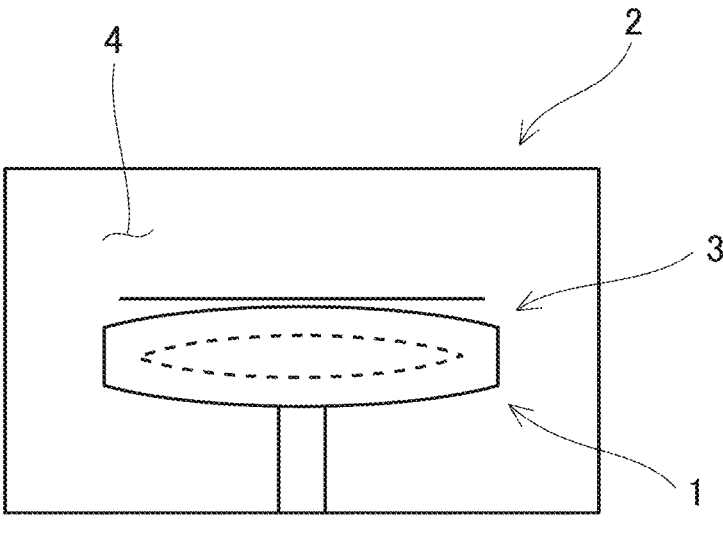
FIG. 1(B) is a conceptual diagram illustrating a state of a process of CVD and Etch when the stage is used for heating.

FIG. 1(A) is a conceptual diagram illustrating a situation of installation of a stage. A stage 1 is usually installed to an inside of a process chamber 2 to manage a temperature of a substrate 3. The process chamber 2 is shut off from external air and is maintained at a desired degree of vacuum. The process chamber 2 may be filled with a process gas 4 to maintain a pressure. Depending on a process chamber of a different type, for example, any chamber including a physical vapor deposition (PVD) chamber, a sputtering chamber, an ion metal implantation (IMP) chamber, a chemical vapor deposition (CVD) chamber, an atomic layer deposition (ALD) chamber, a plasma etching chamber, and an annealing chamber, the pressure of the process gas 4 differs. FIG. 1(B) is a conceptual diagram illustrating a state of a process of CVD and Etch when the stage is used for heating. A usual susceptor is manufactured in the air, and therefore a tensile strength and a creep strength decrease in a high temperature region, and the usual susceptor bulges in a balloon shape microscopically. Especially, to heat the substrate to a Celsius 400 degrees, warpage of the stage becomes several mm in some cases, and a problem occurs in temperature uniformity.

Figure 2:
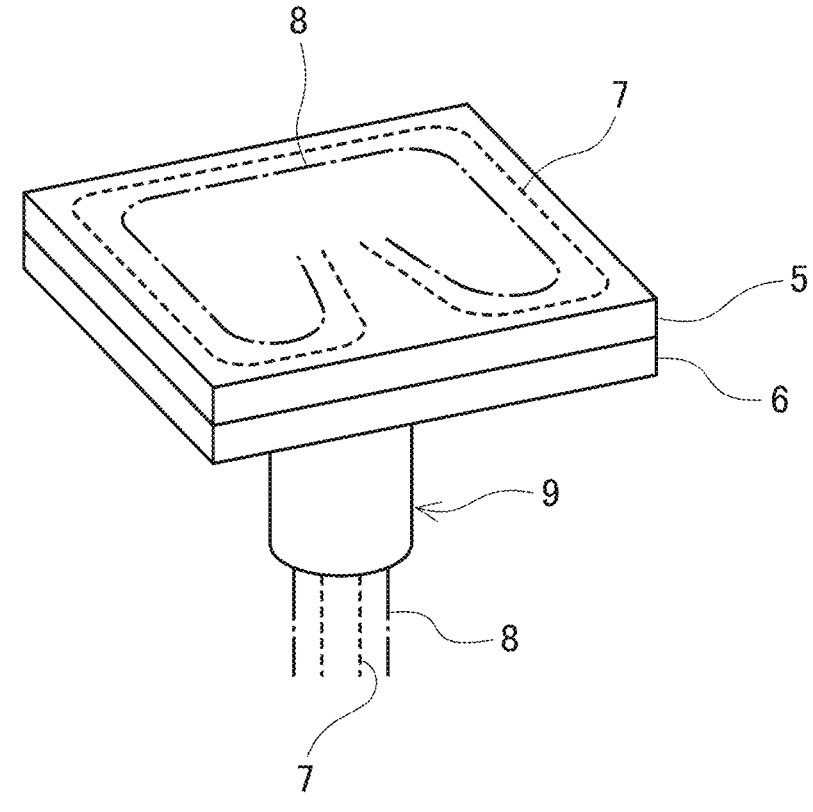
FIG. 2 is a conceptual diagram illustrating an example of a structure of the stage.

FIG. 2 is a conceptual diagram illustrating an example of a structure of the stage. As illustrated in FIG. 2, in the stage 1, a heating unit 7 and a cooling unit 8 are sandwiched between the upper surface table 5 and the lower surface table 6 having a mounting surface on which an object is usually mounted. A table support 9 is mounted on the lower surface table 6, and the heating unit 7 and the cooling unit 8 communicate with the outside of the process chamber 2 through the inside of the table support 9. The temperature of the stage 1 is, for example, around from a room temperature to a Celsius 500 degrees, and when the temperature is low, a liquid can be flowed through the cooling unit (an example of a pipe is illustrated) 8 without using the heating unit 7. In a case where the temperature is high, only the heating unit 7 can be used without using the cooling unit 8. Examples of the material of the stage 1 include a metal, a quartz, Pyrex (registered trademark): heat-resistant glass, and a carbon fiber. Examples of the metal include an aluminum, a copper, and a stainless steel. Examples of the heating unit 7 possibly include a resistance heater, a combination of a heating fluid and a pipe, and a heat pump housed in a groove. Examples of the cooling unit 8 possibly include a combination of a cooling fluid and a pipe and a heat pump housed in a groove. The grooves to house the heating unit 7 and the cooling unit 8 may be disposed in the respective upper surface table 5 and lower surface table 6.

Figure 3:
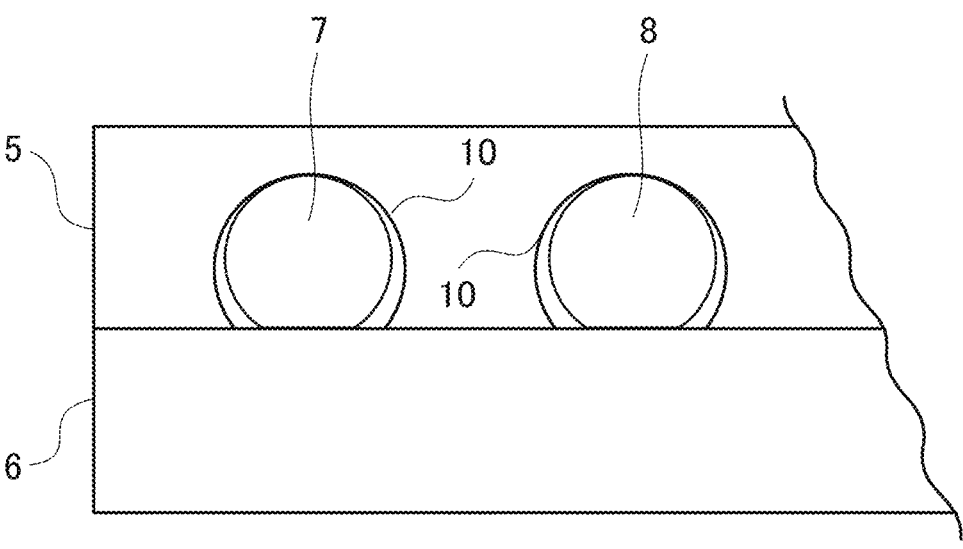
FIG. 3 is a conceptual diagram illustrating an example of a cross-sectional surface of the stage.

FIG. 3 is a conceptual diagram illustrating an example of a cross-sectional surface of the stage. Usually, grooves 10 to improve contact efficiency are installed in the upper surface table 5, and the heating unit 7 and the cooling unit 8 housed in the grooves are sandwiched by the lower surface table 6.

Figure 4:
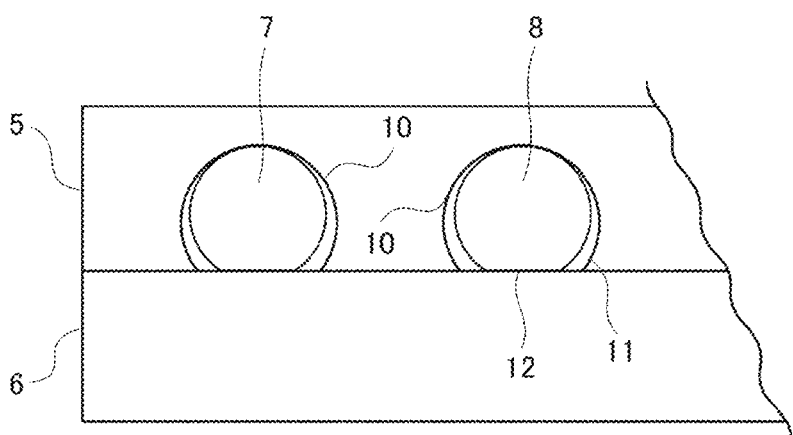
FIG. 4 is a conceptual diagram illustrating an example of the cross-sectional surface of the stage.

FIG. 4 is a conceptual diagram illustrating an example of the cross-sectional surface of the stage. To enhance the contact efficiency of the upper surface table 5 and the heating unit 7 or the cooling unit 8, the stage has a crimped structure using plastic deformation. A part of the heating unit 7, the cooling unit 8, and the upper surface table 5 are plastically deformed to improve the contact efficiency with the upper surface table 5 and the lower surface table 6. The plastic deformation of the upper surface table 5 is denoted by a part 11. There may be a case where the heating unit 7 and the cooling unit 8 are plastically deformed during crimping and the part is denoted by a part 12.

Figure 5:
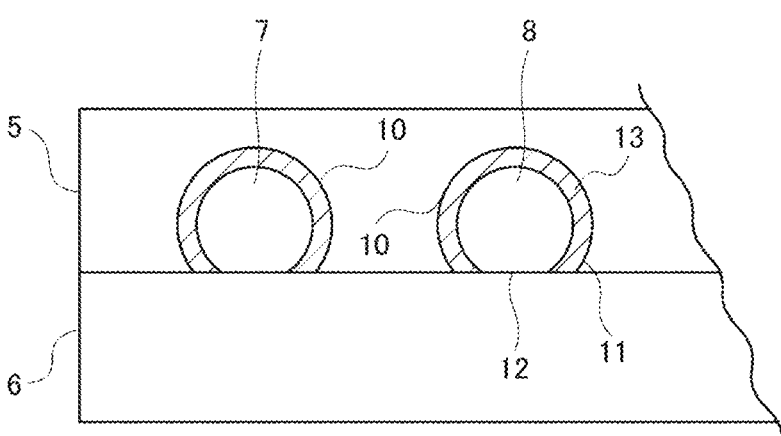
FIG. 5 is a conceptual diagram illustrating an example of use of a heat-conductive medium.

FIG. 5 is a conceptual diagram illustrating an example of use of the heat-conductive medium. Even the structure crimped using plastic deformation to enhance contact efficiency has a minute gap microscopically, and a true contacted area is, for example, only several percent. Therefore, the use of the heat-conductive medium 13 is effective. The heat-conductive medium 13 is possibly a solid, such as a carbon fiber, a grease-like matter, a liquid-like silver, and a gas, such as hydrogen and helium. With the grease-like matter, the liquid, and the gas, sealing can be provided to avoid outflow.

Figure 6:
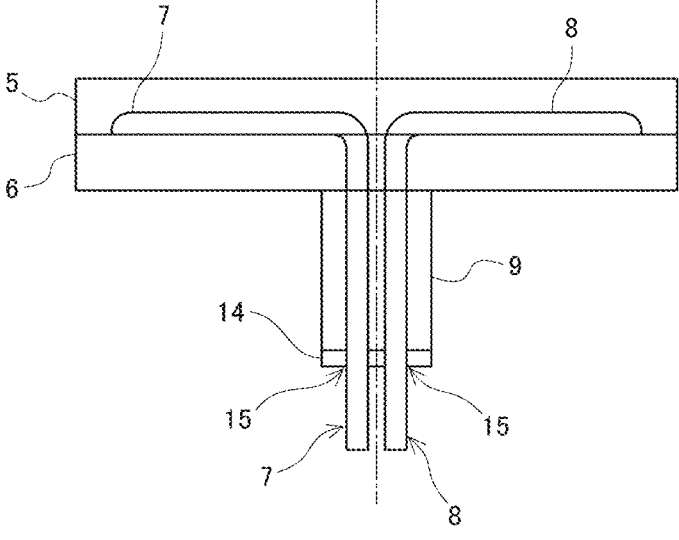
FIG. 6 is a conceptual diagram illustrating an example of using a fluid as the heat-conductive medium.

FIG. 6 is a conceptual diagram illustrating an example of using a fluid as the heat-conductive medium. As illustrated in FIG. 6, when the heat-conductive medium 13 is a fluid, such as the grease-like matter, the liquid, and the gas, the gap is preferably sealed such that the gap is filled with the heat-conductive medium 13 so as not to cause a leakage. For simplification, FIG. 6 illustrates only the heating unit 7 in the left half, and illustrates only the cooling unit 8 in the right half. A sealing plate 14 is mounted on an end portion of the table support 9, and the heating unit 7 and the cooling unit 8 are completely sealed by a sealing portion 15. Sealing the heat-conductive medium 13 shuts off the heat-conductive medium 13 from the atmosphere, thus reducing outflow. In the case of the heat-conductive medium 13 being a gas, press-fitting the gas to the gap allows dramatically increasing heat transfer efficiency.

Figure 7:
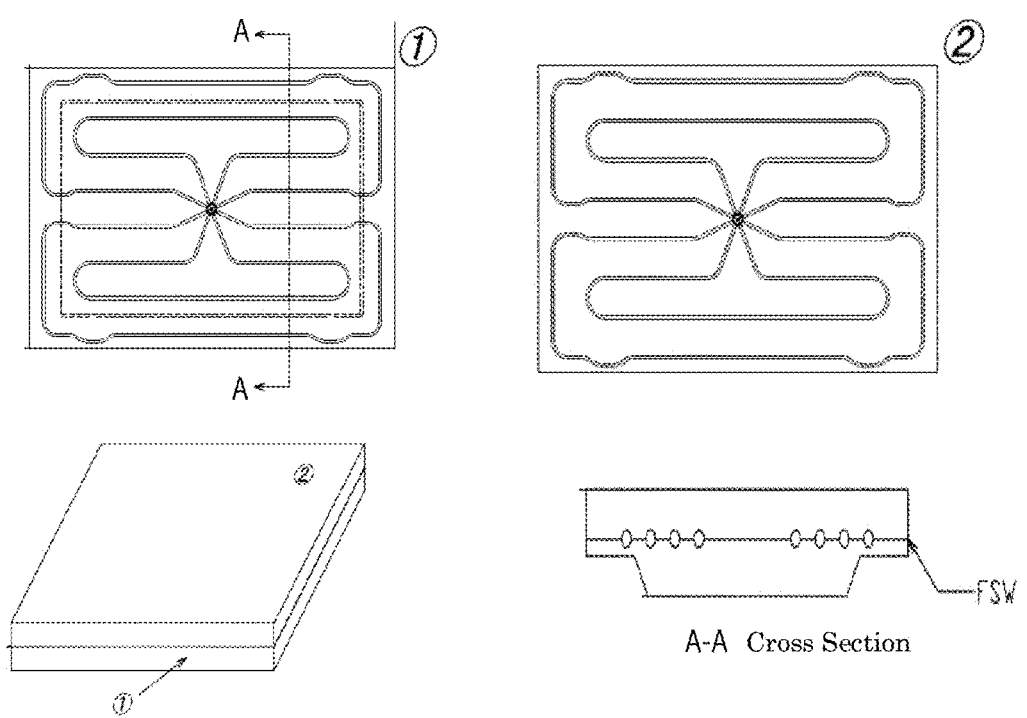
FIG. 7 includes conceptual diagrams illustrating an example of the stage having grooves in both of an upper surface table and a lower surface FIG. 8 includes design drawings of an aluminum plate including a flow passage.

FIG. 7 includes conceptual diagrams illustrating an example of the stage having grooves in both of the upper surface table and the lower surface table constituting the stage body. As illustrated in FIG. 7, the grooves to house the heating unit 7 and the cooling unit 8 may be disposed in the respective upper surface table 5 and lower surface table 6.

The stage can be manufactured, for example, as follows. Machining is performed on two rectangular (for example, a square shape) aluminum plates having a thickness of from 30 to 100 mm and a length per side of from 1500 to 4000 mm to form grooves (flow passages). The material of the stage body is not limited to aluminum and only needs to be a metal. Pipes having an outer shape of from φ5 to φ20 made of stainless steel are inserted into the grooves (the flow passages) thus obtained. After the pipes are inserted into the grooves, the two aluminum plates are brought together, and friction stir welding (FSW welding) is performed on the outer peripheries. When the two aluminum plates are joined together, a gap is formed between the groove of the aluminum plate and the pipe made of stainless steel. Leaving the gap degrades heat transfer efficiency. Therefore, a heat-conductive medium is preferably inserted between the groove of the aluminum plate and the pipe made of stainless steel to improve heat transfer efficiency. For example, before installation of the heating unit and the cooling unit, such as the pipes, in the grooves, a fluid as the heat-conductive medium may be applied over the grooves or the grooves may be internally filled with a gas for sealing after FSW welding. Thus, the stage can be manufactured.

WORKING EXAMPLES

Experimental Example 1

Manufacturing Susceptor for Temperature Control of Glass Substrate

The susceptor is used for temperature control of the glass substrate. The temperature control time of the susceptor affects the process time. A susceptor having a temperature control function was preferred to shorten the time taken for temperature control and improve a throughput.

The susceptor was manufactured as follows.

Figure 8:
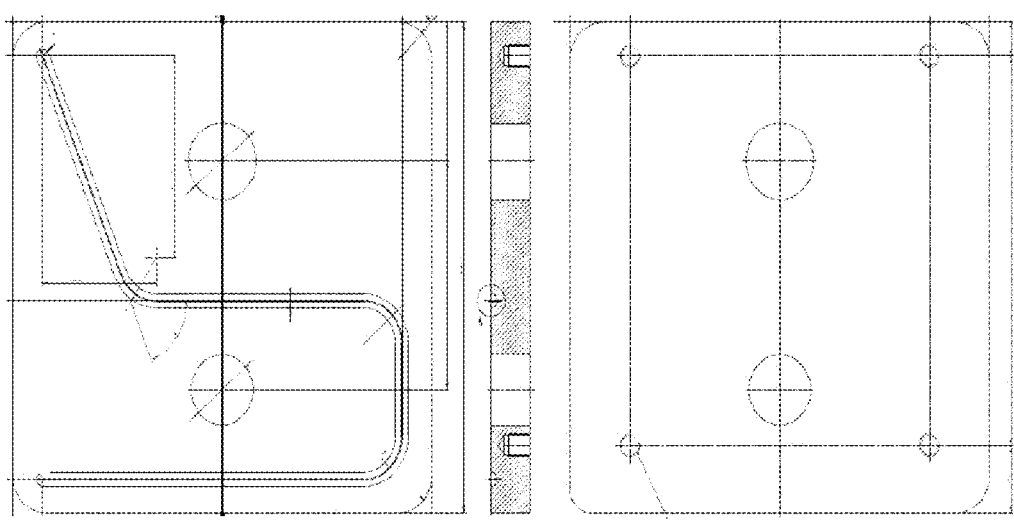

A flow passage was processed in an aluminum plate of a material A6061, and a heater or a heat-conductive medium was flowed in the flow passage for temperature control. FIG. 8 includes design drawings of an aluminum plate including a flow passage. While the stage (the susceptor) is originally used in a vacuum device, here, to measure a temperature change, the temperature change was measured in the atmosphere.

The heat-conductive medium is a solid (for example, a metal, a metallic fiber, a cement, and a fiber), a liquid (for example, a grease and a silver paste), and a gas (for example, helium). Inserting them allows improving heat transfer efficiency.

Figure 9:
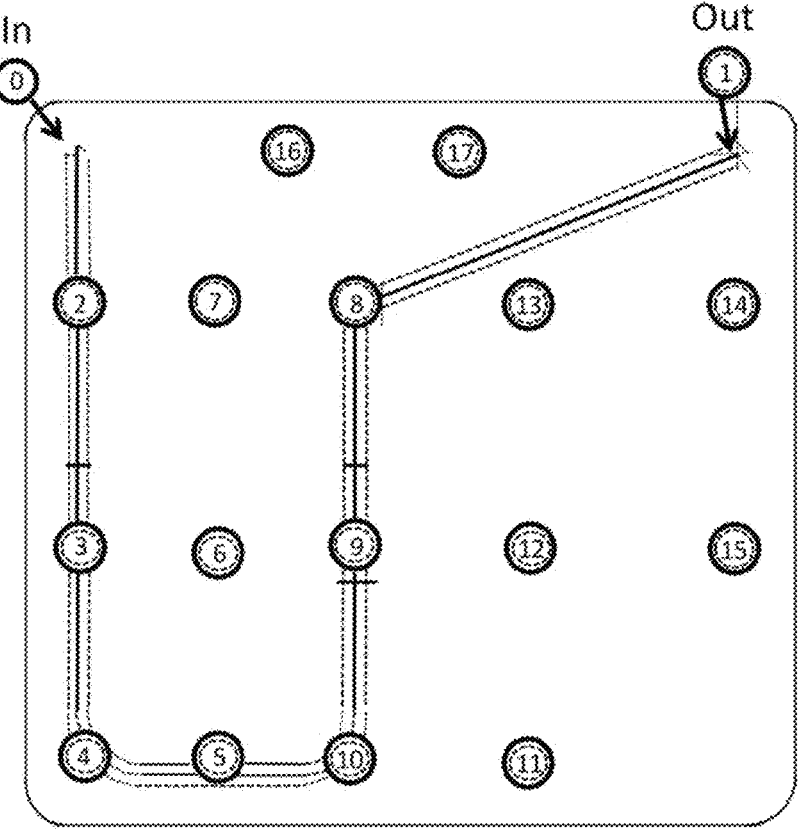
FIG. 9 includes drawings illustrating a state of the stage on which thermocouples are mounted.

Machining was performed on one of the two aluminum plates having four sides of 400 mm and the thickness of 40 mm to form a groove, a SUS pipe was inserted, and after that the outer periphery was joined by FSW to create a substrate. A helium gas was press-fitted to a gap between the SUS pipe and the aluminum plate to fill the helium gas. Thermocouples were mounted on 18 locations in one aluminum plate, boiling water at 80° C. was flowed through the SUS pipe to measure the temperature change. FIG. 9 includes drawings illustrating a state of the stage on which the thermocouples are mounted. The right part in FIG. 9 is a photograph.

Experimental Example 2

Except for not using a heat-conductive medium, a stage was manufactured similarly to Experimental Example 1 to measure the temperature change.

Experimental Example 3

Except for using a silicon grease as a heat-conductive medium, a stage was manufactured similarly to Experimental Example 1 to measure the temperature change. The silicon grease was applied over the groove before insertion of the SUS pipe into the groove.

Experimental Example 4

Except for using a silver paste as the heat-conductive medium, a stage was manufactured similarly to Experimental Example 1 to measure the temperature change. The silver paste was applied over the groove before insertion of the SUS pipe into the groove.

Results

Figure 10:
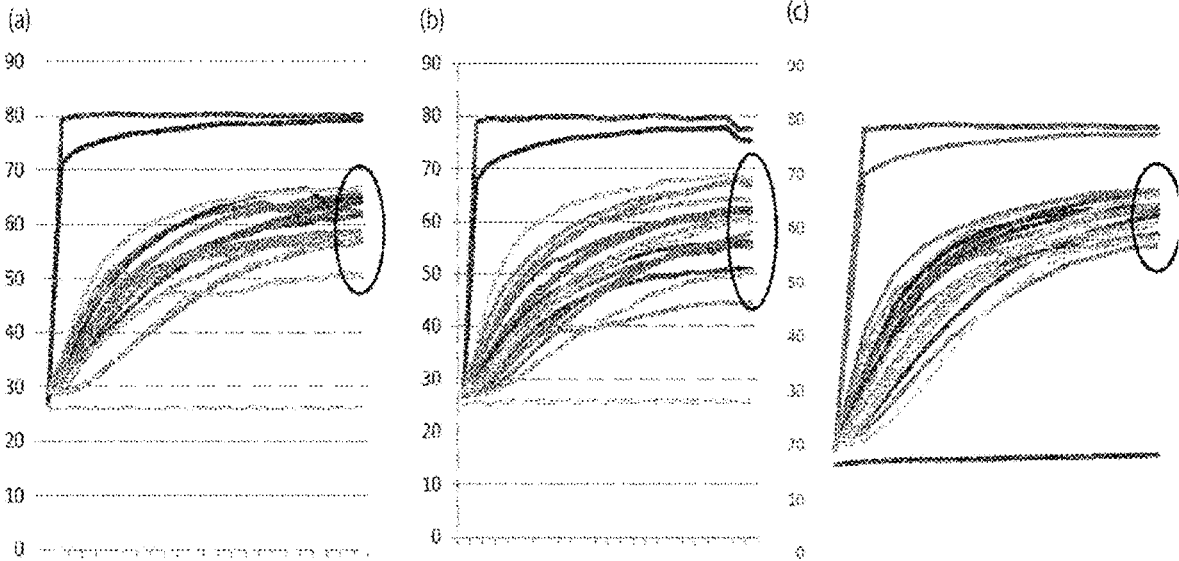
FIG. 10 includes graphs substituted for drawings illustrating temperature changes at respective parts of the stage.

FIG. 10 includes graphs substituted for drawings illustrating temperature changes at respective parts of the stage. FIG. 10 illustrates the temperature changes in Experimental Example 2 (FIG. 10(*a*)), Experimental Example 3 (FIG. 10(*b*)), and Experimental Example 4 (FIG. 10(*c*)). The vertical axis plots the temperature, and the horizontal axis plots the elapsed time. It was found that thermal resistances of the silicon grease and the silver paste were about ½ in comparison to the case of without the heat-conductive medium and the heat transfer efficiency was improved. Additionally, since the thermal resistance of the helium gas is the lowest and becomes less than ½, improvement in heat transfer efficiency is estimated.

INDUSTRIAL APPLICABILITY

Since this invention relates to the stage also used as the susceptor used, for example, inside a vacuum chamber, this invention can be used in the semiconductor fabrication industry, the panel production industry, and the production industry of solar power generation panel.

DESCRIPTION OF REFERENCE SIGNS

1 . . . stage
2 . . . process chamber
3 . . . substrate
4 . . . process gas
5 . . . upper surface table
6 . . . lower surface table
7 . . . heating unit
8 . . . cooling unit
9 . . . table support
10 . . . groove
11 . . . plastically deformed part
12 . . . plastically deformed part
13 . . . heat-conductive medium
14 . . . sealing plate
15 . . . sealing portion

What is claimed is:
1. A stage which is configured to be installed inside a chamber for heating or cooling an object, the stage comprising:
 a stage body having a mounting surface on which the object is mounted;

a heating unit; and a cooling unit, wherein the stage body further comprises:

a first groove into which the heating unit is inserted; and a second groove into which the cooling unit is inserted, 5 wherein a heat-conductive medium is provided in a first gap between the first groove and the heating unit as well as in a second gap between the second groove and the cooling unit, wherein the heat-conductive medium is a helium gas 10 having a pressure of from 0.1 atmospheres to 100 atmospheres, both inclusive, and wherein each of the first gap and the second gap is a hermetically sealed space isolated from an external atmosphere outside the stage, and the heat-conductive medium is 15 contained within each of the first gap and the second gap.

2. A vacuum device comprising the stage according to claim 1 as a susceptor.

3. The vacuum device according to claim 2, wherein the vacuum device is used to manufacture a semiconductor 20 integrated circuit, a flat display panel, or a solar cell panel.

4. A method for manufacturing a semiconductor integrated circuit, a flat display panel, or a solar cell panel using the vacuum device according to claim 2.

5. The stage according to claim 1, wherein the helium gas 25 has a pressure of from 2 atmospheres to 10 atmospheres, both inclusive.

* * * * *